(12) United States Patent
Hurwitz et al.

(10) Patent No.: US 8,031,407 B2
(45) Date of Patent: Oct. 4, 2011

(54) IMAGING ASSEMBLY

(75) Inventors: Jonathan Ephriam David Hurwitz, Edinburgh (GB); Ewan Findlay, Edinburgh (GB)

(73) Assignee: STMicroelectronics Ltd., Marlow-Buckinghamshire (GB)

( * ) Notice: Subject to any disclaimer, the term of this patent is extended or adjusted under 35 U.S.C. 154(b) by 1747 days.

(21) Appl. No.: 11/201,555

(22) Filed: Aug. 11, 2005

(65) Prior Publication Data

US 2006/0033833 A1    Feb. 16, 2006

(30) Foreign Application Priority Data

Aug. 13, 2004    (EP) .................................. 04254868

(51) Int. Cl.
*G02B 1/00*      (2006.01)
*G02B 27/42*     (2006.01)
*G02B 27/00*     (2006.01)
*G02B 13/18*     (2006.01)

(52) U.S. Cl. ........ 359/642; 359/558; 359/577; 359/637; 359/708; 359/738

(58) Field of Classification Search .......... 359/619–629, 359/664, 738, 642, 558, 577, 637, 708
See application file for complete search history.

(56) References Cited

U.S. PATENT DOCUMENTS

| 5,633,527 | A | 5/1997 | Lear .............................. 257/432 |
| 5,859,685 | A | 1/1999 | Gupta et al. ................... 351/159 |
| 6,627,305 | B1 | 9/2003 | Deane et al. ............... 428/304.4 |
| 7,495,840 | B2 * | 2/2009 | Schuster ........................ 359/651 |
| 2002/0154239 | A1 | 10/2002 | Fujimoto et al. .............. 348/340 |
| 2003/0197210 | A1 | 10/2003 | Uchida .......................... 257/294 |

FOREIGN PATENT DOCUMENTS

| EP | 0523825 | 1/1993 |
| WO | WO2004027880 | 4/2004 |

* cited by examiner

*Primary Examiner* — Scott J Sugarman
(74) *Attorney, Agent, or Firm* — Lisa K. Jorgenson; Allen, Dyer, Doppelt, Milbrath & Gilchrist, P.A.

(57) ABSTRACT

An imaging assembly for an image sensor may include a lens, a transparent substrate and two aspherical optical coatings on each side of the substrate. The imaging assembly can also incorporate an opaque coating with an opening in-line with the lens to form an aperture, an anti-reflection coating, and an infrared filter coating.

33 Claims, 1 Drawing Sheet

IMAGING ASSEMBLY

FIELD OF THE INVENTION

The present invention relates to an imaging assembly, and, more particularly, but not exclusively, to an imaging assembly for use with solid state image sensors and a method of manufacturing the imaging assembly.

BACKGROUND OF THE INVENTION

As image sensors are incorporated into low cost cameras and other devices, such as mobile cellular telephones and personal digital assistants having a main function that may not be capturing images, it is preferable to minimize the cost of the image sensor. Image sensors usually require a focussing lens as part of an imaging assembly so that a representation of a subject may be reproduced. In addition, the imaging assembly may incorporate other components such as additional lens elements, an aperture and an infra-red (IR) filter. Typically, prior art imaging assemblies mount individual components in a support structure commonly referred to as a barrel. The lenses and barrel are usually made from low cost materials, such as plastic. Generally, prior-art imaging assemblies of this type are intentionally low cost and can suffer from problems of limited chromatic correction and difficulties surviving elevated temperatures.

Typically, chromatic correction is required because a lens will not focus light of different wavelengths on the same point. Focal length depends on refraction, and the index of refraction for short wavelengths (for example, blue light) is larger than that of longer wavelengths (for example, red light). This is termed chromatic aberration of a lens.

It may also be beneficial for an imaging assembly to be able to withstand elevated temperatures. One reason for this is that solid state image sensors are often subjected to a re-flow solder process. The re-flow solder process requires that the image sensor be passed through a re-flow oven that melts solder deposits to electrically connect various elements. In a fixing operation, prior to passing the image sensor through a reflow oven, components of the image sensor are fixed in place. Because the imaging assembly cannot tolerate the temperature of the reflow oven, it is fixed in place in a separate fixing operation. It would be advantageous if only one fixing operation was needed for all components.

Typically, the components associated with prior art barrel imaging assemblies have optical properties that are modified by elevated temperature, and, therefore may not be suitable for a re-flow solder process.

SUMMARY OF THE INVENTION

In view of the foregoing background, it is therefore an object of the present invention to provide an imaging assembly that may be relatively low cost, that may be less subject to chromatic aberration, and that may survive elevated temperatures.

This and other objects, features and advantages in accordance with the invention are provided by an imaging assembly comprising a substrate that is at least partially transparent, and at least one optical layer that is at least partially transparent, and wherein the at least one optical layer is on the substrate. In some embodiments, a substrate may have a generally planar surface. The imaging assembly may further comprise at least one lens fixed to the substrate, with the at least one optical layer at least partially covering the at least one lens. The imaging assembly may also further comprise an opaque coating on the substrate with an aperture in the opaque coating. The imaging assembly may further comprise an infrared filter. The infrared filter may be a coating which prevents the transmission of infrared electromagnetic radiation.

The at least one optical layer may be an aspherical surface. The at least one optical layer may include a first optical layer and a second optical layer, with the first optical layer being on one side of the substrate and the second optical layer being on the other side.

The at least optical layer may have an anti-reflection structure. The at least one optical layer may have optical diffractive properties.

The imaging assembly may provide chromatic correction, with the chromatic correction provided by differing refractive indices of the at least one lens, the substrate and the at least one optical layer. The at least one optical layer may have at least one location point enabling relative positioning with respect to the rest of the imaging assembly.

The at least one lens may be a hemispherical lens. The at least one lens may be glass, and the substrate may be glass. The at least one optical layer may be a UV cured adhesive.

According to a second aspect of the present invention there is provided a method of manufacturing an imaging assembly having a substrate. The method may comprise the steps of: depositing at least one surface layer on at least one surface of the substrate, and replicating optical properties of the at least one surface layer to form at least one optical layer.

The method may further comprise the step of fixing at least one lens to the substrate. The depositing step may further comprise depositing the at least one surface layer on the at least one lens as well as the at least one surface of the substrate. The method may further comprise the step of depositing an opaque coating on the substrate, with the opaque coating having a transparent passage therethrough forming an aperture.

The method may further comprise the step of depositing an infrared coating on the substrate, with the infrared coating preventing the transmission of infrared electromagnetic radiation. Fixing the at least one lens may comprise gluing the at least one lens to the substrate.

The replicating step may further comprises molding the at least one surface layer to form the at least one optical layer. The replicating step may further comprise creating an aspheric surface on the at least one surface layer to form the at least one optical layer. Alternatively or further preferably, the replicating step may further comprise creating an anti-reflection property of the at least one surface layer to form the at least one optical layer. Alternatively or further preferably, the replicating step may further comprise creating optical diffractive properties of the at least one surface layer to form the at least one optical layer.

The method may further comprise curing the at least one surface layer, with the at least one surface layer being cured by ultraviolet electromagnetic radiation.

According to a third aspect of the present invention there is provided an optical pointing device comprising an imaging assembly according to the first aspect of the invention. The optical pointing device may be an optical mouse.

According to a fourth aspect of the present invention there is provided a mobile device comprising an imaging assembly according to the first aspect of the invention. The mobile device may be a mobile cellular telephone. Alternatively, the mobile device may be a camera.

BRIEF DESCRIPTION OF THE DRAWING

Embodiments of the present invention will now be described with reference to the accompanying drawings, in which.

DETAILED DESCRIPTION OF THE PREFERRED EMBODIMENTS

Figure 1:
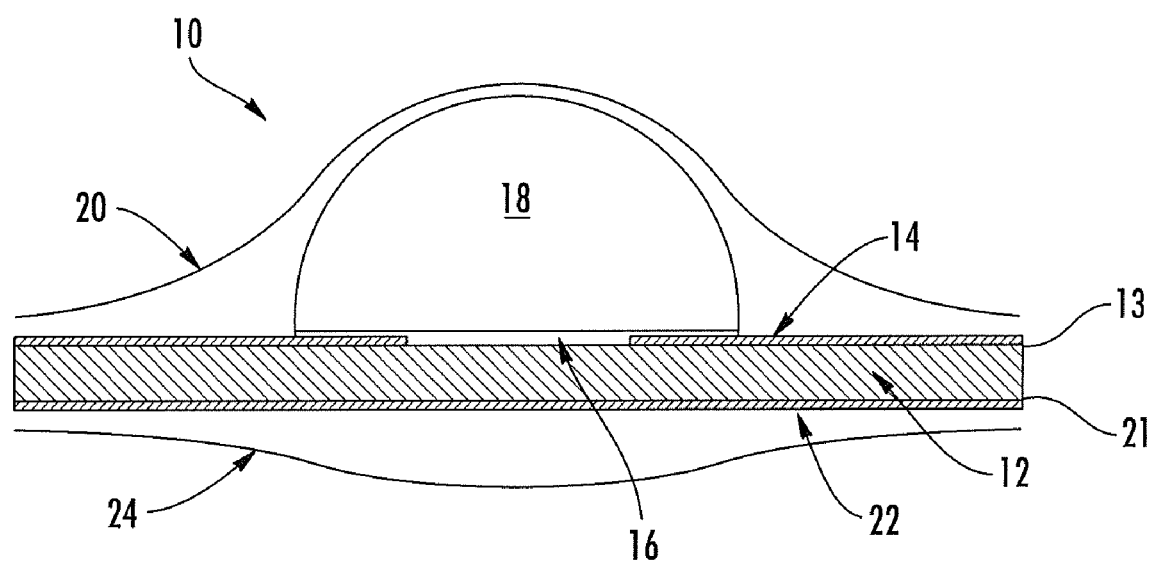
FIG. 1 illustrates an imaging assembly according to the present invention.

Referring to FIG. 1, an imaging assembly 10 has a substrate 12 having an upper surface 13 with an opaque coating 14, the opaque coating 14 having an opening 16 that forms an aperture. A hemispherical lens 18 is glued to the substrate 12 above the opaque coating 14 on the upper surface 13 in line with the opening 16. A first optical layer 20 covers the substrate 12 on the upper surface 13 including the opaque coating 14 and lens 18. The substrate 12 has a lower surface 21 with an infrared coating 22 and a second optical layer 24 covering both the lower surface 21 and the infrared coating 22.

In the embodiment illustrated in FIG. 1 the imaging assembly 10 provides a complete optical package, in this case, including a lens and optical layer for focussing and chromatic correction, an aperture for determining the amount of light to reach an image sensor, and an infrared filter to prevent infrared radiation from impinging on the image sensor. It should be appreciated that although the imaging assembly 10 includes the opaque coating 14 and infrared coating 18 these components may be separate elements from the imaging assembly 10.

The substrate 12 can be made of glass or other transparent or partially transparent material. Glass provides an ability to withstand elevated temperatures, such as that found in a reflow soldering oven. More than one imaging assembly 10 can be manufactured on the substrate 12 at a time and the substrate 12 can be subsequently diced at completion. It is also possible, to dice the substrate 12 at other points in the process depending on logistics of manufacture.

The hemispherical lens 18 may also be made of glass or other transparent or partially transparent material. Again, glass has the advantage of being able to survive elevated temperatures. A glass hemispherical lens may be produced by standard ball grinding, polishing and cleaving techniques.

The lens 18 may be a shape other than a hemisphere. It may be appropriate to have lesser sections of spheres or other shapes of lenses. Although a single lens is shown in FIG. 1, it is also possible to have more than one lens encased within the optical layer 20 as required by the desired optical characteristics.

The opaque coating 14 with the opening 16 that forms an aperture for the imaging assembly 10 can be manufactured by printing or by photolithography on the substrate 12. The infrared coating 22 can be deposited on the substrate 12 using standard processes such as sputtering.

In FIG. 1, the first optical layer 20 provides an aspheric optical surface, as does the second optical layer 24. The first and second optical layers 20, 24 in combination with the hemispherical lens 18 provide light focussing optical properties. The refractive indices of the first and second optical layers 20, 24, the lens 18 and the substrate 12 are chosen to provide at least a degree of chromatic correction if required.

The first and second optical layers 20, 24 may be manufactured by depositing a surface layer of optical quality epoxy resin over the substrate 12 and any other components such as the lens 18. Once deposited, a suitable molding element is pressed into the surface layer while it is still in a liquid state. The surface layer may then be cured by ultraviolet radiation before removing the molding element.

It is not necessary to have aspherical surfaces on both the first and second optical layers 20, 24. It may be advantageous to have a planar surface, which may be used as a reference surface, on one of the first and second optical layers 20, 24 and an aspherical surface on the other. It is also possible to form other types of optical elements on the optical layers 20, 24, such as an anti-reflective structure or an optical diffractive element. An anti-reflective surface may be formed by molding micro-features of a particular depth and spacing to form a negative interference effect in reflection. An optical diffractive element may be formed by a series of ridges, or other micro-features positioned so as to form an interference pattern similar to that produced by a refracting lens.

In addition, the first and second optical layers 20, 24 may have non-optical features introduced, for example, such as location points for locating the imaging assembly 10 directly on an imaging sensor surface or other reference surface.

The imaging assembly may be of high quality and may be capable of low cost manufacturing and incorporating encapsulated features, such as the aperture and infrared filter. In addition, the imaging assembly affords chromatic correction through the use of materials with differing refractive indices. Furthermore, the imaging assembly can withstand elevated temperatures, such as those found in a reflow solder oven. This allows the imaging assembly to be included in a manufacturing step of an image sensor prior to the reflow solder process.

Mass-production of the imaging assembly is easily achieved on a single substrate. A number of imaging assemblies can be wholly or partially constructed on the substrate before dicing into individual imaging assemblies.

Thus, the imaging sensor is applicable to a broad range of devices. An imaging assembly can be incorporated in a wide range of image sensors, which may be incorporated in such devices as a camera, particularly a digital camera, a mobile cellular telephone incorporating a digital camera, and an optical mouse. It will be appreciated that standard techniques may be employed by one skilled in the art to implement the image sensor in these and other ways. Improvements and modifications may be incorporated without departing from the scope of the present invention.

That which is claimed is:

1. An imaging assembly comprising:
   a substrate that is at least partially transparent;
   at least one optical layer that is at least partially transparent and that is adjacent said substrate;
   at least one lens shaped as a section of a sphere being fixed to said substrate and being at least partially covered by said at least one optical layer;
   said substrate, said at least one optical layer, and said at least one lens having different refractive indices providing chromatic correction.

2. An imaging assembly according to claim 1 wherein said at least one lens comprises glass.

3. The imaging assembly according to claim 1 further comprising an opaque coating on said substrate with an aperture therein.

4. The imaging assembly according to claim 1 further comprising an infrared filter adjacent said substrate.

5. The imaging assembly according to claim 4 wherein said infrared filter comprises a coating that prevents transmission of infrared electromagnetic radiation.

6. The imaging assembly according to claim 1 wherein said at least one optical layer defines an aspherical surface.

7. The imaging assembly according to claim 1 wherein said at least one optical layer comprises a first optical layer adjacent a first side of said substrate and a second optical layer adjacent a second side of said substrate opposite the first side.

8. The imaging assembly according to claim 1 wherein said at least optical layer comprises an anti-reflection structure.

9. The imaging assembly according to claim 1 wherein said at least one optical layer has optical diffractive properties.

10. The imaging assembly according to claim 1 wherein said at least one optical layer has at least one location point enabling relative positioning.

11. The imaging assembly according to claim 1 wherein said at least one optical layer comprises a UV cured adhesive.

12. The imaging assembly according to claim 1 wherein said substrate comprises glass.

13. An imaging assembly comprising:
a substrate that is at least partially transparent;
at least one optical layer that is at least partially transparent and that is adjacent said substrate;
at least one hemispherical lens being fixed to said substrate and being at least partially covered by said at least one optical layer;
said substrate, said at least one optical layer, and said at least one hemispherical lens having different refractive indices providing chromatic correction.

14. The imaging assembly according to claim 13 further comprising an opaque coating on said substrate with an aperture therein.

15. The imaging assembly according to claim 13 further comprising an infrared filter adjacent said substrate.

16. The imaging assembly according to claim 13 wherein said at least one optical layer defines a spherical surface.

17. The imaging assembly according to claim 13 wherein said at least one optical layer comprises a first optical layer adjacent a first side of said substrate and a second optical layer adjacent a second side of said substrate opposite the first side.

18. A device comprising:
an imaging assembly comprising
a substrate that is at least partially transparent,
at least one optical layer that is at least partially transparent and that is adjacent said substrate, and
at least one lens fixed to said substrate and being at least partially covered by said at least one optical layer,
said substrate, said at least one optical layer, and said at least one lens have different refractive indices providing chromatic correction.

19. The device according to claim 18 further comprising an opaque coating on said substrate with an aperture therein.

20. The device according to claim 18 further comprising an infrared filter adjacent said substrate.

21. The device according to claim 18 wherein said at least one optical layer defines an aspherical surface.

22. The device according to claim 18 wherein said at least one optical layer comprises a first optical layer adjacent a first side of said substrate and a second optical layer adjacent a second side of said substrate opposite the first side.

23. The device according to claim 18 wherein the device comprises at least one of an optical mouse, a cellular telephone, and a camera.

24. A method of manufacturing an imaging assembly comprising a substrate, the method comprising:
depositing at least one surface layer on at least one surface of the substrate;
replicating optical properties of the at least one surface layer to form at least one optical layer;
fixing at least one lens to the substrate, the at least one lens being at least partially covered by the at least one optical layer, the substrate, the at least one optical layer, and the at least one lens have different refractive indices providing chromatic correction.

25. The method according to claim 24 further comprising depositing the at least one surface layer on the at least one lens.

26. The method according to claim 24 further comprising depositing an opaque coating on the substrate, the opaque coating having a transparent passage therethrough forming an aperture.

27. The method according to claim 24 further comprising depositing an infrared coating on the substrate, the infrared coating preventing transmission of infrared electromagnetic radiation.

28. The method according to claim 24 wherein depositing comprises gluing at least one lens to the substrate.

29. The method according to claim 24 wherein replicating further comprises molding the at least one surface layer to form the at least one optical layer.

30. The method according to claim 29 wherein an aspheric surface is molded on the at least one surface layer to form the at least one optical layer.

31. The method according to claim 24 wherein replicating comprises creating an anti-reflection property of the at least one surface layer.

32. The method according to claim 24 wherein replicating comprises creating an optical diffractive property of the at least one surface layer.

33. The method according to claim 24 further comprising curing the at least one surface layer by ultraviolet electromagnetic radiation.

* * * * *

UNITED STATES PATENT AND TRADEMARK OFFICE
CERTIFICATE OF CORRECTION

| | | |
|---|---|---|
| PATENT NO. | : 8,031,407 B2 | Page 1 of 1 |
| APPLICATION NO. | : 11/201555 | |
| DATED | : October 4, 2011 | |
| INVENTOR(S) | : Hurwitz et al. | |

It is certified that error appears in the above-identified patent and that said Letters Patent is hereby corrected as shown below:

IN THE SPECIFICATIONS:

Column 2, Line 40      Delete: "comprises"
                       Insert: --comprise--

IN THE CLAIMS:

Column 4, Line 67, claim 8      Insert: --one-- between "least" and "optical".

Signed and Sealed this
Thirteenth Day of March, 2012

David J. Kappos
*Director of the United States Patent and Trademark Office*